United States Patent [19]

Jensen et al.

[11] Patent Number: 5,187,439
[45] Date of Patent: Feb. 16, 1993

[54] MAGNETIC RESONANCE TOMOGRAPHY METHOD FOR GENERATING SEPARATE FAT AND WATER IMAGES, AND APPARATUS FOR PERFORMING THE METHOD

[75] Inventors: Jens D. Jensen; Wolfgang Vollmann, both of Hamburg, Fed. Rep. of Germany

[73] Assignee: U.S. Philips Corp., New York, N.Y.

[21] Appl. No.: 609,962

[22] Filed: Nov. 6, 1990

[30] Foreign Application Priority Data

Nov. 10, 1989 [DE] Fed. Rep. of Germany ....... 3937428

[51] Int. Cl.⁵ ............................................ G01R 33/20
[52] U.S. Cl. ............................................ 324/309
[58] Field of Search ............... 324/300, 307, 308, 309, 324/310, 311, 312, 313, 314; 128/653.2, 653.5

[56] References Cited

U.S. PATENT DOCUMENTS

| | | | |
|---|---|---|---|
| 4,628,262 | 12/1986 | Maudsley | 324/309 |
| 4,818,941 | 4/1989 | McKinnon | 324/309 |
| 4,950,992 | 8/1990 | Nakabayashi et al. | 324/309 |
| 4,983,918 | 1/1991 | Nakabayashi | 324/309 |
| 5,079,505 | 1/1992 | Deimling et al. | 324/311 |

FOREIGN PATENT DOCUMENTS 0224310 11/1986 European Pat. Off. .

OTHER PUBLICATIONS

Dikon, "Simple Proton Spectroscopic Imaging!", Radiology, vol. 153, Oct. 1984, pp. 189-194.
"0.1 Human Fat/Water Separation by SIDAC" Manabe et al. Magnetic Resonance in Medicine 5, Nov. 1987 pp. 492-501.
"Simultaneous Multislice Acquisition of MR Images" Weaver et al. Magnetic Resonance in Medicine 8, Nov. 1988 pp. 275-284.
"Simple Proton Spectroscopic Imaging" Dixon, Radiology Magazine, vol. 153 (1984) pp. 189-194.

Primary Examiner—Michael J. Tokar
Attorney, Agent, or Firm—Jack D. Slobod

[57] ABSTRACT

A magnetic resonance imaging method for generating separate fat and water images of at least one slice utilizes a plurality of sequences acting on the slice in the presence of a steady magnetic field, each sequence including at least one first RF pulse, followed by a phase encoding gradient during which the spin resonance signal formed in the slice is detected, groups of sequences being formed with a position in time of the measuring gradient and/or a further RF pulse, if any, which differs from one group to another, the number of sequences per slice being twice as large as necessary for the formation of a similar image without fat/water separation. The phase encoding gradient is varied in steps from one sequence to another. The separate fat and water images (F,W) are formed from the resultant spin resonance signals by 2D Fourier transformation.

7 Claims, 3 Drawing Sheets

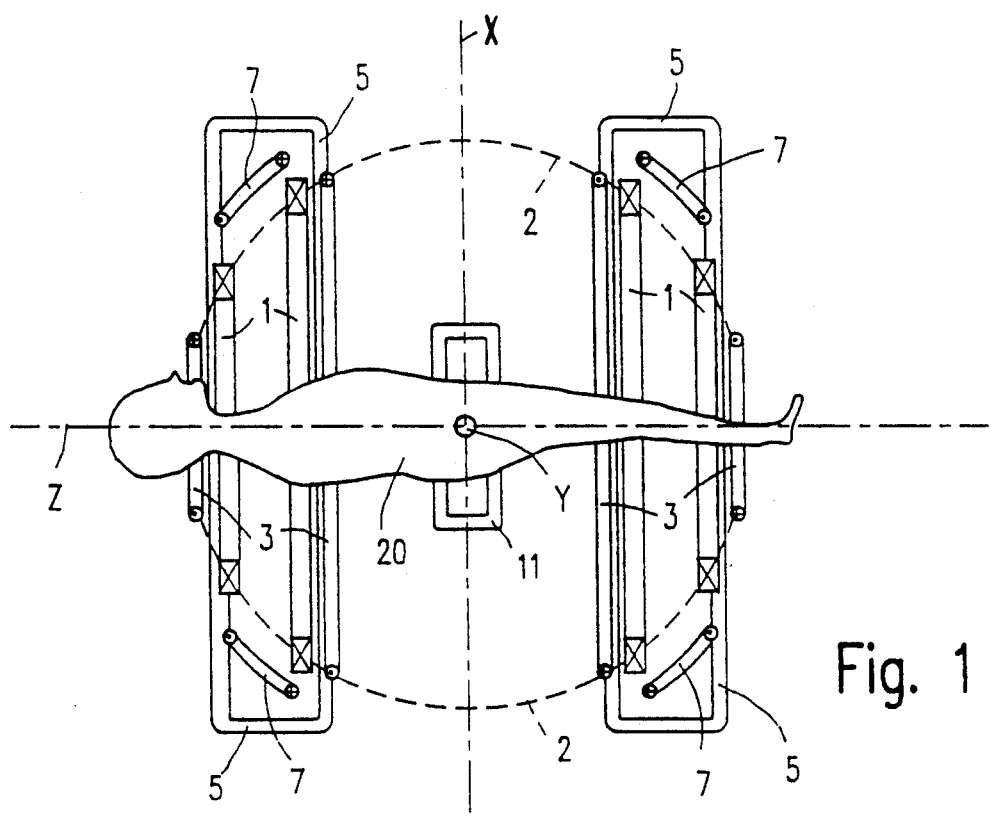
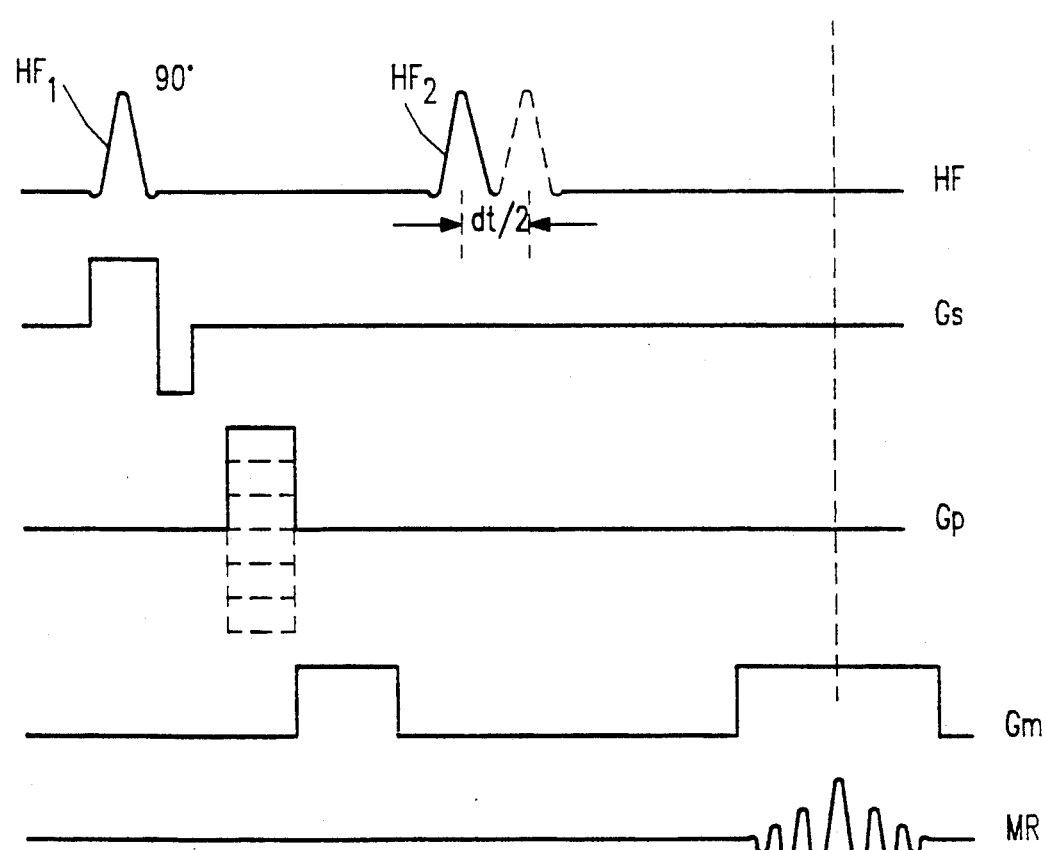
Fig. 1
Fig. 3

MAGNETIC RESONANCE TOMOGRAPHY METHOD FOR GENERATING SEPARATE FAT AND WATER IMAGES, AND APPARATUS FOR PERFORMING THE METHOD

BACKGROUND OF THE INVENTION

1. Field of the Invention

The invention relates to magnetic resonance imaging method for generating separate fat and water images of at least one slice where a plurality of sequences act on the slice in the presence of a steady magnetic field, each sequence comprising at least one first RF pulse which is followed by a phase encoding gradient as well as a magnetic gradient during which the spin resonance signal generated in the slice is detected, groups of sequences being formed with a position in time of the measuring gradient and/or a further RF pulse if any, which differs from one group to another, the number of sequences per slice being twice as large as necessary to generate a similar image without fat/water separation.

2. Description of the Related Art

The invention further relates to a magnetic resonance apparatus. A method of this kind is known from an article by Dixon in the magazine "Radiology", Vol. 153 (1984), pp. 189–194. A version which requires only one RF pulse per sequence is disclosed in EP-A 224 310, which corresponds to commonly owned U.S. Pat. No. 4,818,941. The known methods have a common aspect in that each sequence is repeated once, merely the distance in time between the RF pulses of the sequence or the distance in time between the single RF pulse and the measuring gradient being varied. Thus, two groups of sequences are formed. The number of sequences in each group corresponds to the number (N) of pixels in the direction of the phase encoding gradient for the images (fat or water) to be generated. The spin resonance signals from the two groups, occurring each time for the same phase encoding gradient, differ merely in that one of the components to be separated, for example the fat component, for one signal has a phase position which opposes that for the other spin resonance signal. Therefore, separate fat and water images can be generated in that either first the two groups of sequences are subjected to a respective two-dimensional Fourier transformation, the slice images thus produced being subtracted, or in that first the difference between the spin resonance signals obtained with the same phase encoding gradient is formed, the difference signals thus obtained being subjected to a two-dimensional Fourier transformation.

SUMMARY OF THE INVENTION

It is an object of the present invention to provide a method for generating separate fat and water images which uses a different approach. On the basis of the method disclosed above, this object is achieved in that the phase encoding gradient is varied in steps from one sequence to another, the phase angles of each time one RF pulse of the sequence being varied by the same amounts from one step to another, a fat image and a water image being formed by two-dimensional Fourier transformation of the spin resonance signals thus obtained.

Thus, in accordance with the invention the phase encoding gradient is varied in steps from one sequence to another, so that no sequence has the same phase encoding gradient as any other sequence. According to the known method all RF pulses may have the same phase angle, but the phase angle in accordance with the invention changes from one step to another. In order to generate separate fat or water images of a slice containing N pixels in the direction of the phase encoding gradient and M pixels in the direction of the measuring gradient (where, for example $N=M=256$), 2N sequences must be successively executed, for which each time M amplitude values of the (demodulated) spin resonance signal must be digitized. The 2N spin resonance signals thus produce a $2N*M$ data set which is subjected to a Fourier transformation. This Fourier transformation produces a long image which consists of $2N*m$ pixels and which is composed of a fat image and a water image containing each time $N*M$ pixels.

In a version of the invention for generating fat or water images of several slices each time one RF pulse in each sequence is shaped so that the slices are simultaneously excited by the sequence, the phase of the RF pulses being varied from one slice to another and from one sequence to another.

The method in accordance with the invention for generating separate fat and water images of several slices could in principle be successively performed for each of the slices, but also in a time-interleaved manner (multiple slice). According to the method in accordance with the invention, however, the slices are simultaneously excited, thus achieving the advantages of signal averaging as regards the signal-to-noise ratios such as obtained in the case of a 3D method. Therefore, for generating separate fat and water images for s slices, $2s*N$ sequences are generated with phase encoding gradients which are varied in each time the same steps from one sequence to another. The two-dimensional Fourier transformation over the sampling values produced by the sampling of the spin resonance signals associated with the sequences produces a single "long image" which is composed of s fat images and s water images.

BRIEF DESCRIPTION OF THE DRAWING

The invention will be described in detail hereinafter with reference to the drawing. Therein:

FIG. 1 shows a magnetic resonance examination apparatus in which the invention can be used, FIG. 3 shows the variation in time of a sequence whereby the method in accordance with the invention can be carried out.

DETAILED DESCRIPTION OF THE PREFERRED EMBODIMENTS

Figure 2:
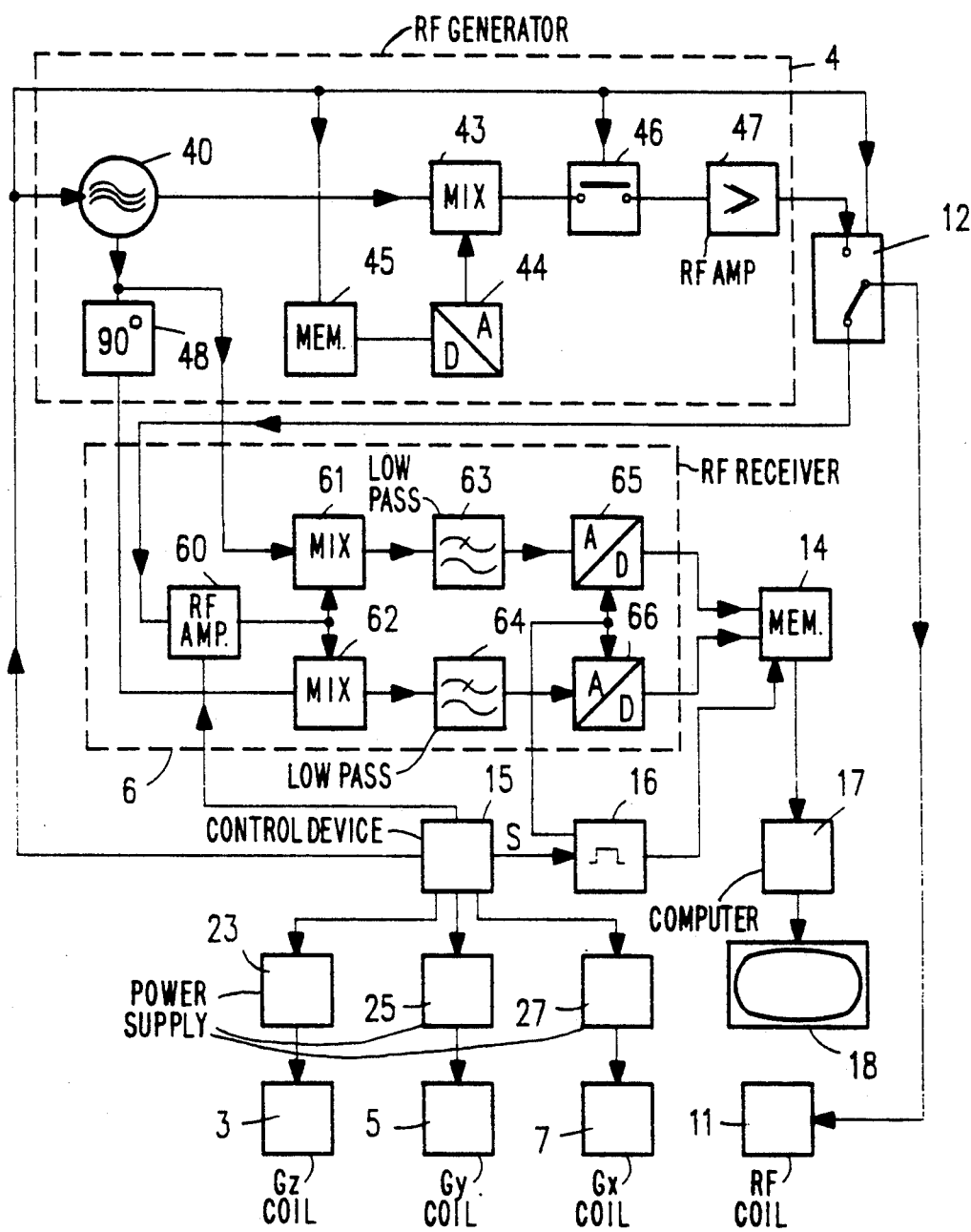
FIG. 2 shows a block diagram of such an apparatus.

The magnetic resonance examination apparatus shown in FIG. 1 comprises a system which consists of four coils 1 for generating a uniform, steady magnetic field which may have a strength amounting to a fraction of one Tesla but also to some Tesla. This field extends in the z direction of a cartesian coordinate system. The coils which are concentrically arranged with respect to the z axis may be provided on a spherical surface 2. The patient 20 to be examined is arranged within these coils.

Four coils 3 which serve to generate a magnetic field Gz which extends in the z direction and which linearly varies in this direction are preferably arranged on the same spherical surface. There are also provided four coils 7 which also generate a magnetic gradient field (i.e. a magnetic field whose strength varies linearly in one direction) Gx which also extends in the z-direction but whose gradient extends in the x-direction. A gradient field Gy which extends in the z direction and which has a gradient in the y-direction is generated by four coils 5 which may have the same shape as the coils 7 but which are arranged so as to be offset 90° with respect thereto. Only two of these four coils are shown in FIG. 1.

Because each of the three coil systems 3, 5 and 7 for generating the magnetic gradient fields Gz, Gy and Gx is symmetrically arranged with respect to the spherical surface 2, the field strength at the center of the sphere, at the same time being the origin of said cartesian xyz coordinate system, is determined only by the steady, uniform magnetic field of the coil system 1. Furthermore, an RF coil 11 is symmetrically arranged with respect to the plane z=0 of the coordinate system, which coil is constructed so that it generates an essentially uniform RF magnetic field which extends in the x direction, i.e. perpendicularly to the direction of the steady, uniform magnetic field. During each RF pulse, the RF coil receives an RF modulated current from an RF generator. Subsequent to a sequence, the RF coil 11 or a separate RF receiving coil serves to receive the spin resonance signals generated in the examination zone.

FIG. 2 shows a simplified block diagram of this magnetic resonance examination apparatus. Via a switching device 12, the RF coil 11 is connected on the one side to an RF generator 4 and on the other side to an RF receiver 6.

The RF generator 4 comprises an RF oscillator 40 which can be digitally controlled as regards frequency and phase by a control unit 15, which oscillator delivers oscillations of a frequency corresponding to the Larmor frequency of the nuclei to be excited at the field strength generated by the coils 1. As is known, the Larmor frequency f is calculated as f=cB, where B is the magnetic induction in the steady, uniform magnetic field and c is the gyromagnetic ratio which, for example for protons amounts to 42.56 MHz/T. The output of the oscillator 40 is connected to an input of a mixing stage 43. The mixing stage receives a second input signal from a digital-to-analog converter 44 whose output is connected to a digital memory 45. The memory stores a number of envelope signals, each in the form of a series of digital data words, one of which is read for each sequence.

The mixing stage 43 processes the input signal applied thereto so that a carrier oscillation modulated with the envelope signal appears on its output. The output signal of the mixing stage 43 is applied, via a switch 46 which is controlled by the control unit 15, to an RF power amplifier 47 whose output is connected to the switching device 12. This device is also controlled by the control device 15.

The receiver 6 comprises an RF amplifier 60 which is connected to the switching device and which receives the spin resonance signals induced in the RF coil 11; for this it is necessary that the switching device occupies the corresponding position. The amplifier 60 comprises a muting input which is controlled by the control device 15 and via which it can be blocked so that the gain is substantially zero. The output of the amplifier is connected to the first inputs of two multiplying mixing stages 61 and 62, each of which supplies an output signal corresponding to the product of its input signals. The second inputs of the mixing stages 61 and 62 receive a signal having the frequency of the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low pass filters 63 and 64 which suppress the frequency supplied by the oscillator 40 as well as all higher frequencies and which transmit low-frequency components, to a respective analog-to-digital converter 65, 66. The latter converts the analog signals of the circuit 61 . . . 64, forming a quadrature demodulator, into digital data words which are applied to a memory 14. The analog-to-digital converters 65 and 66 as well as the memory 14 receive their clock pulses from a clock pulse generator 16 which can be blocked and enabled, via a control lead, by the control unit 15, so that the signals supplied by the RF coil 11 and transposed to the low-frequency range can be converted into a series of digital data words for storage in the memory 14 only during a measuring interval defined by the control device 15.

The data words stored in the memory 14 form a data field wherefrom a computer 17 calculates a long image by two-dimensional Fourier transformation, which image is composed of a fat image and a water image for each slice, for example one image thereof being applied to a suitable monitor 18.

As shown in FIG. 2, control device 15 also controls the power supplies for the respective gradient coils 3, 5 and 7.

FIG. 3 shows the variation in time of a sequence whereby the method in accordance with the invention can be carried out. The first line shows the position in time of the RF pulses of a sequence. The first RF pulse HF$_1$ is accompanied by a slice selection gradient G$_s$ (second line), so that one or (in the case of a suitable variation in time of the envelope of the first RF pulse) several slices are excited. After the first RF pulse a phase encoding gradient G$_p$ is generated which is varied in steps from one sequence to another (third line). The fourth line of FIG. 3 shows the variation in time of the measuring gradient G$_m$. The three gradients G$_s$, G$_p$ and G$_m$ extend perpendicularly to one another. They may be identical to a respective one of the three gradients Gx, Gy or Gz, but need not be so. A measuring gradient G$_m$ is switched on and off after the first RF pulse and before the second RF pulse.

The second RF pulse HF$_2$ is a 180° pulse which generates a spin echo signal in conjunction with the first RF pulse HF$_1$. This spin echo signal exhibits its maximum at an instant whose distance in time from the second RF pulse equals the distance in time between the two RF pulses HF$_1$ and HF$_2$. After the second RF pulse, the magnetic gradient field is switched on again, i.e. so that at the instant at which the maximum of the spin echo signal occurs the time integral over the measuring gradient G$_m$ prior to the RF pulse HF$_2$ is exactly equal to the time integral over this gradient after the pulse HF$_2$. The spin resonance signal MR (a spin echo signal) generated by such a sequence is sampled while the measuring gradient G$_m$ is switched on. During this time interval, the control device 15 enables the clock oscillator 16 (FIG. 2), so that the spin resonance signal is stored in the memory 14 in the form of M digital sampling values.

In order to carry out the method in accordance with the invention, the sequence shown in FIG. 3 is repeated 2N times with multiple modifications, where N (for example, 256) is the intended number of pixels for one slice image in the direction of the phase encoding gradient G$_p$. For a slice image with N=256 pixels, 2N sequences must be performed per slice, so 512 sequences for a single slice.

As has already been stated, the sequences are not repeated in an identical manner, but in three respects: a) For every second sequence, the position in time of the second RF pulse HF$_2$ is shifted by dt/2, so that the spin echo signal generated by the two RF pulses HF$_1$ and HF$_2$ exhibits its maximum a period of time dt later. In this respect=1/(2df), where df is the difference between the Larmor frequencies of fat-bound protons and water-bound protons (df amounts to approximately 3.4 ppm of the Larmor frequency f). This modification is also included in the Dixon method.

b) The phase encoding gradient is varied in 2N equally large steps (for one slice). Therefore, no sequence has a phase encoding gradient which is equal to that of any other sequence, ignoring multiple repeats of the entire method for improvement of the signal-to-noise ratio. In contrast therewith, according to the Dixon method there are each time two sequences having the same phase encoding gradient.

c) In response to the step-wise variation of the phase encoding gradient, the phase of the first RF pulse HF$_1$ is changed by a constant amount of each time 90°. In contrast therewith, according to the Dixon method the phase of the RF pulses is the same in all sequences.

Figure 4A:
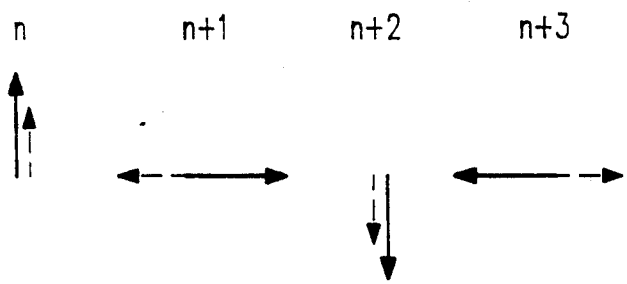
FIG. 4a shows the position of the magnetization vectors in successive sequences in the case of excitation of a single slice.

For the sake of clarity FIG. 4a shows the position occupied by the nuclear magnetization vectors of water-bound protons (non-interrupted line) and fat-bound protons (broken line) in the slice excited by HF$_1$, that is to say each time at the instant of reception (interrupted vertical line in FIG. 3). Four sequences comprising successive steps n, n+1 ... n+3 of the phase encoding gradient are shown, it being assumed that the nuclear magnetization vectors of fat and water have the same direction at the n$^{th}$ step, i.e. that the RF pulse HF$_2$ has the position in time denoted by non-interrupted lines in FIG. 3.

In the sequence with the subsequent step n+1 of the phase encoding gradient the nuclear magnetization vector for the water-bound protons in the slice has been rotated through 90° in comparison with the step n; the fat component has the opposite phase position with respect to the water component. In the next step n+2, the nuclear magnetization vector for water has been rotated through a further 90°, and the nuclear magnetization vectors of fat and water occupy the same phase position again. In the next step n+3 the two nuclear magnetization vectors are in phase opposition again, the nuclear magnetization vector for water having been rotated through a further 90° with respect to the step n+2.

For the sequences with the subsequent steps of the phase encoding gradient (n+4 etc.), the same position of the nuclear magnetization vectors occurs as in the steps n etc.

The 90° shift of the nuclear magnetization vector of water is achieved in that the phase of the signal supplied by the oscillator 40 is switched through 90° by the control unit 15 from one step to the other of the phase encoding gradient, the frequency of the oscillator signal corresponding to the Larmor frequency of water in the excited slice. The alternating in-phase and anti-phase state of the nuclear magnetization vectors of water and fat is achieved in that for the sequences comprising the steps n, n+2 etc., the phase encoding gradient of the RF pulse HF$_2$ has the position denoted by a non-interrupted line in FIG. 3, and has the position in time which is denoted by an interrupted line in FIG. 3 in the steps n+1, n+3 etc.

Figure 4B:
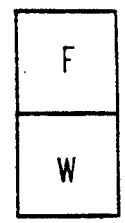
FIG. 4b shows the long image then produced.

After 2N sequences have been executed in this manner, during which 2N spin resonance signals have been converted into respective series of M digital data words, a two-dimensional data field is obtained which contains M sampling values with each time the same phase encoding gradient and 2N sampling values which have the same position in time within the receiving interval. Therefore, when a two-dimensional Fourier transformation is performed as regards this position in time and as regards the phase encoding gradient, a long image is obtained as shown in FIG. 4b which comprises 2N pixels in the direction of the phase encoding gradient and M pixels in the direction of the measuring gradient. This long image comprises a fat image and a water image of the slice, each image containing N*M pixels.

In the sequence shown in FIG. 3 in association with FIG. 4a, phase differences between fat and water are produced by variation of the position in time of HF$_2$ (in relation to HF$_1$). The same effect, however, can also be obtained when the position in time of HF$_2$ always remains the same and when instead in each second sequence the measuring gradient G$_m$ occurring in conjunction with the spin echo signal is shifted by the period of time dt. Therefore, it is also possible to use a sequence which always comprises only a single RF pulse as already described in detail in EP-OS 224 310. On the other hand, use can also be made of sequences comprising more than two RF pulses, for example three 90° pulses which generate a stimulated echo signal. In that case the phase position of the first RF pulse could remain constant and that of the third RF pulse could be varied instead, in which case the latter pulse must be slice-selective.

The foregoing description dealt with a method of generating a fat image and a water image of a single slice. However, it is often necessary to obtain such images of several slices. The described method could in principle be successively applied to several slices for this purpose, for which it would merely be necessary to vary the frequency of the RF pulses. The time involved in such an approach could be reduced by a multiple slice method where the other slices are excited before exciting a slice again. That method is referred to as a so-called 2D method which is known to be inferior to the 3D method as regards signal-to-noise ratio.

Therefore, the use of the invention for a preferred 3D method will be described hereinafter, i.e. the so-called POMP method (Glover et al, SMRM 1988, p. 241). According to this method, exclusively the slices to be examined are simultaneously excited by an RF pulse, be it with a different phase which changes from one sequence to another. For the formation of separate fat and water images of s slices, each containing n pixels in the direction of the phase encoding gradient, 2s*N sequences are then generated, the phase encoding gradient also being changed in 2s*N equal steps. The digitizing of the spin resonance signals thus obtained produces a data field comprising 2s*N*M sampling or amplitude values which are subjected to a 2D Fourier transformation. The result of this transformation is a long image consisting of s slice images. The POMP method can also be applied without objection to a few parallel slices, even when these slices are not directly adjacent. The fat/water separation according to this POMP method may involve sequences, such as shown in FIG. 3. However, use can alternatively be made of other sequences. It is only important that at least one slice-selective RF pulse, one phase encoding gradient and one measuring gradient are involved.

The method described hereinafter with reference to the FIGS. 5a and 5b serves to produce a respective fat and water images for, for example two slices which need not necessarily be adjacent. To this end, the phase encoding gradient is varied in 4N steps (in a corresponding number of sequences). FIG. 5a shows the nuclear magnetization in the two slices in eight successive steps n . . . n+7, the nuclear magnetization vectors of one slice (q=1) being shown in the left-hand column, whilst those of the other slice (q=2) are shown in the right-hand column.

In the step n, the nuclear magnetization vectors of fat and water point in the same direction in both slices at the instant of reception (broken vertical lines in FIG. 3). In the next step n+1, however, the nuclear magnetization of the water component has been rotated counter-clockwise through 45° (−45°) and the fat component has been rotated clockwise through 135° (+135°), so that fat and water are in anti-phase. For the second slice, however, the water component has been rotated through +45° and the fat component through −135°. This phase rotation continues in the next steps (n+2 etc.) for each slice and each of the two components, the phase rotation remaining the same, so that the same position of the nuclear magnetization vectors is obtained again after n+8 steps of the phase encoding gradient.

For the excitation of two slices, notably slices which are not directly adjacent, it would in principle be necessary to generate two RF pulses having oscillator frequencies, corresponding to the different Larmor frequencies resulting from the effect of the slice-selective gradient $G_s$ (second line of FIG. 3). Each of these two RF pulses should have an envelope suitable for exciting one slice, generally a so-called sinc function. However, it can be demonstrated that the same effect can be achieved by means of a single RF pulse whose oscillator frequency is situated halfway between said Larmor frequencies, is then necessary to modulate said envelope with an oscillation whose frequency corresponds to half the difference between said Larmor frequencies. The phase position of this oscillation determines the phase position of the nuclear magnetization vectors. Therefore, eight of such envelope signals should then be stored in the memory 45, which signals are cyclically read so that each time one of these eight signals determines the envelope of the RF pulse HF$_1$ so as to adjust the phase position of the nuclear magnetization in the two slices associated with this envelope signal. The alternating in-phase and anti-phase states of the fat and water components in the two slices are achieved (like in the method described with reference to the FIGS. 4a and 4b) in that in the sequences comprising the steps n+2, n+4, n+6 etc. the second RF pulse HF$_2$ occupies the position in time denoted by a non-interrupted line in FIG. 3, whilst during the intermediate steps n+1 . . . n+7 etc. it should occupy the position in time which is denoted by a broken line in FIG. 3.

Figure 5B:
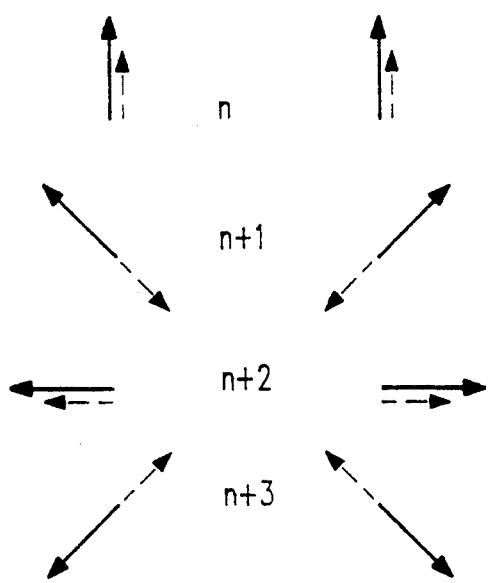
FIG. 5b shows the long image then produced.

After 4N sequences have been executed in the described manner, a data field is obtained which consists of 4N×M sampling values which is converted into the long image of FIG. 5b by way of a 2D Fourier transformation, which long image consists of two fat images F1, F2 of the two slices and two water images W1, W2, the two water images being situated in the centre.

Separate fat and water images of more than two slices can also be formed. In that case the envelope signals are usually even more complex. 2s*N sequences must then be executed, the phase encoding gradient $G_p$ having to be varied in steps equal to dG or integer multiples of dG from one sequence to another. The phase encoding gradient $G_p$ for the various sequences then satisfies:

$$G_p = n \cdot dG + G_{po} \qquad (1)$$

Therein, $G_{po}$ is a suitably chosen initial value, for example $G_o = -G_{max}/2$, and n is one of 2s*N successive integers. dG satisfies:

$$dG = G_{max}/(2s \times N) \qquad (2)$$

Therein, $G_{max}$ is the gradient required to achieve the desired resolution.

The phase position to be occupied by the RF pulse in the various slices then satisfies:

$$P_1 = n \cdot 180°(q+a)/s \qquad (3)$$

Therein, $P_1$ is the phase position in degrees, q is an integer between 1 and s and characterizes each time one slice. These numbers can be consecutively associated with the slices to be examined, so that for the lower slice q=1 and for the upper slice q=s (or vice versa); however, it is alternatively possible to assign these numbers to the slices at random. Such a random assignment, corresponding to a random phase sequence of the RF excitation in successive slices, however, requires very complex envelope signals; therefore, it usually makes more sense to numerate the slices to be examined in an ascending or descending order.

The quantity a is a constant which can be chosen at random per se. However, it has been found that a is preferably chosen to be 0.5 or an odd multiple thereof. This is because in the case of a different choice of a, one of the fat or water images in the long image is divided, so that one part thereof is situated at the upper end whilst the other part is situated at the lower end of the long image; moreover, complex envelopes would be required to realise the necessary variation in time of the RF pulse.

It appears from the equation (3) that the phase $P_1$ of the RF magnetization varies by the amount 180°(q+a)/s from one step to another (i.e. upon variation of n by +1 or −1). In the embodiment shown in FIG. 5a, s=2 and a=−3/2, so that a variation of 45° is obtained. From one slice to another $P_1$ is changed by the amount 180°/s (with n constant).

The shifting of the second RF pulse or the gradient field in the various steps results from the equation for the relative phase position $P_2$ between fat and water, where:

$$P_2 = n*180°*b/s \qquad (4)$$

Therein, b is an integer factor which can be chosen in the range of from 1 to s and which is constant for all 2sN sequences. When $P_2=0°$, 360° or a multiple of 360°, no shift in time occurs; $HF_2$ thus occupies the position in time denoted by the non-interrupted line. However, if $P_2$ corresponds to 180° or 540°, 900° etc., $HF_2$ must be shifted by dt/2, as shown in FIG. 3, or the measuring gradient must be shifted by dt (with a constant position of the RF pulse $HF_2$).

For the formation of fat or water images of only a single slice in accordance with the embodiment shown in the FIGS. 4a and 4b, b can assume only the value 1, so that for s=1 phase positions of alternately 0° and 180° are obtained whereto possibly an integer multiple of 360° is added. The same is applicable in the case of several slices s, if b is chosen to equal s; therefore, in the embodiment shown in FIG. 5a, b=2. If b were chosen to equal 1, a larger variation range would be obtained. The phase difference $P_2$ would then cyclically vary between 0°, 90°, 180° and 270°, so that the second RF pulse $HF_2$ would have to be shifted through 0, 1/(8df), through 1/(4df) and through 3/(8df) in four successive sequences.

Therefore, for the shift in time dt of $HF_2$ it holds good that:

$$dt = n'*b/s*1/(4df) \qquad (5)$$

where n' is an integer which is as small as possible and the following relationship exists between n and n':

$$n = n' + y*s \qquad (6)$$

where y is a suitably chosen integer. If a negative value results for dt from the equation (5), the distance between $HF_1$ and $HF_2$ should be reduced by dt. If instead of $HF_2$ the measuring gradient $G_p$ is to be shifted in time, the value of dt resulting from the equation (5) should be doubled.

Figure 5B:
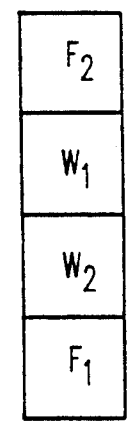
Figure 5A:
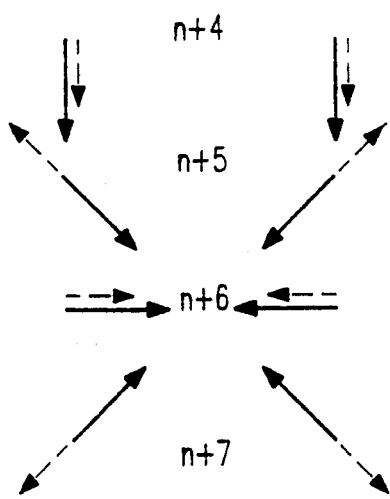
FIG. 5a shows the position of the magnetization in the case of excitation of two slices.

As has already been stated, for s slices such a method produces 2sN spin resonance signals with 2sNM amplitude values of the spin resonance signal. These digitized values form a data field which comprises each time M values for the same phase encoding gradient ($G_p$=constant) and each time 2sN values with the same position in time (t=constant) within a sequence. A 2D Fourier transformation $F(G_p, t)$ thus produces a long image which comprises M pixels in one direction and 2sN pixels in the other direction. It is composed of 2s fat images and water images, the distance between a fat image and a water image of the same slice amounting to exactly s images in the example shown in FIG. 5. Whether the fat or water images together form a coherent block or not depends on the choice of the value b (equation 4). If b is chosen to be 1, fat and water images succeed one another in an alternating fashion, whilst if b=s, all fat or water images form a coherent block. The factor b thus indicates how many images of the same kind (fat or water) belong to a block of images within a long image.

We claim:

1. A magnetic resonance imaging method for generating separate fat and water images of at least one slice, where a number of successive sequences act on the slice in the presence of a steady magnetic field, which sequences are alternated between two groups, each sequence of each of said two groups comprising a first RF pulse ($HF_1$) which is followed by a phase encoding gradient ($G_p$) as well as measuring gradient during which a spin resonance signal generated in the slice is detected, a position in time of the measuring gradient ($G_m$) or of a second RF pulse ($HF_2$) relative to said first RF pulse (HF1) differing from one of said groups to the other, wherein an integral of the phase encoding gradient ($G_p$) is varied by a step from each sequence to the next, a phase angle ($P_1$) of one slice-selective RF pulse ($HF_1$) of each sequence is varied by a same amount from each sequence to the next, and a fat image and a water image (F, W) are formed by two-dimensional Fourier transformation of spin resonance signals (MR) thus obtained.

2. A method as claimed in claim 1 for forming a fat image and a water image of a single slice, wherein said one slice-selective RF pulse is the first RF pulse (HF1), and said position in time of either the measuring gradient ($G_m$) or the second RF pulse ($HF_2$) from the first pulse is varied by being alternately increased and decreased by the same amount.

3. A method as claimed in claim 1 for forming separate fat and water images of several slices, wherein said one slice-selective RF pulse in each sequence is shaped to simultaneously select the several slices, and that the phase angle ($P_1$) of the slice-selective RF pulse is varied from each sequence to the next.

4. A method as claimed in claim 1, for forming separate fat and water images of several slices, wherein the slice-selective RF pulse has a phase angle ($P_1$) in a $q^{th}$ slice and in an $n^{th}$ step of the integral of the phase encoding gradient ($G_p$) satisfies $$P_1 = n*(q+a)*180°/s,$$

s being the number of slices.

5. A method as claimed in claim 3, wherein from one step to another of the integral of the phase encoding gradient ($G_p$) the distance in time between the first RF pulse ($HF_1$) and either the measuring gradient ($G_m$) the second RF pulse ($HF_2$) is increased or decreased.

6. A magnetic resonance apparatus for generating separate fat and water images of at least one slice comprising means (1) for generating a uniform, steady magnetic field, means (23, 25, 27) for generating magnetic gradient fields, and means (4) for generating RF pulses, the means (4) for generating RF pulses being constructed so that the phase position ($P_1$) of at least one of the RF pulses (HF1) can be varied from one sequence to another, means for detecting spin resonance signals, and control means for controlling said means for generating magnetic gradient fields, said means for generating RF pulses, and said means for detecting spin resonance signals in a manner that a number of successive sequences act on the slice in the presence of said steady magnetic field, which sequences are alternated between two groups, each sequence of each of said two groups comprising at least one first RF pulse ($HF_1$) which is followed by a phase encoding gradient ($G_p$) as well as a measuring gradient during which a spin resonance signal generated in the slice is detected, a position in time of the measuring gradient ($G_m$) or of a second RF pulse ($HF_2$) relative to said at least one first RF pulse (HF1) differing from one of said groups to the other, wherein an integral of the phase encoding gradient ($G_p$) is varied by a step from each sequence to the next, a phase angle ($P_1$) of one slice-selective RF pulse ($HF_1$) of each sequence is varied by a same amount from each sequence to the next, and a fat image and a water image (F, W) are formed by two-dimensional Fourier transformation of spin resonance signals (MR) thus obtained.

7. An apparatus as claimed in claim 6, wherein the means for generating RF pulses comprises a modulator (43) in which a signal of an RF oscillator (40) is modulated by the signal from an envelope memory (45) which stores a number of envelope signals which are read in a cyclical order.

* * * * *